United States Patent
An et al.

(10) Patent No.: US 6,744,286 B1
(45) Date of Patent: Jun. 1, 2004

(54) SYSTEM AND METHOD FOR COMPARATOR THRESHOLD ADJUSTMENT

(75) Inventors: Hongming An, San Diego, CA (US); Bruce Harrison Coy, San Diego, CA (US); Shyang Kye Kong, San Diego, CA (US); Brian Lee Abernathy, Escondido, CA (US); Paul Edward Vanderbilt, Encinitas, CA (US)

(73) Assignee: Applied MicroCircuits Corp., San Diego, CA (US)

( * ) Notice: Subject to any disclaimer, the term of this patent is extended or adjusted under 35 U.S.C. 154(b) by 0 days.

(21) Appl. No.: 10/217,215

(22) Filed: Aug. 12, 2002

(51) Int. Cl.[7] ............................................. H03K 5/153
(52) U.S. Cl. ........................... 327/60; 327/63; 327/65
(58) Field of Search ........................... 327/60, 63, 65, 327/68, 72, 74, 77, 82, 90, 93; 357/316, 76

(56) References Cited

U.S. PATENT DOCUMENTS 5,392,317 A * 2/1995 Cho et al. .................... 375/76
5,949,257 A * 9/1999 Ishikawa ...................... 327/72
6,359,939 B1 * 3/2002 Calderone .................. 375/316

* cited by examiner

Primary Examiner—Kenneth Wells
Assistant Examiner—Hiep Nguyen
(74) Attorney, Agent, or Firm—Law Office of Gerald Maliszewski; Gerald Maliszewski

(57) ABSTRACT

A system and method are provided for compensating a comparator threshold level. The method comprises: accepting an input signal with an ac component; lowpass filtering the input signal to generate the input signal average voltage; accepting the input signal average voltage; accepting a first dc level; summing the average voltage with the first dc level; supplying a first sum as a first comparator threshold level; comparing the input signal to the first comparator threshold level; and, supplying a first comparator output signal with an ac component. In some aspects of the method, accepting a first dc level includes accepting a plurality of dc levels. Then, the average voltage is summed with each of the plurality of dc levels and supplied as a corresponding plurality of comparator threshold levels. The input signal is compared to each of the comparator threshold levels and a plurality of comparator output signals are supplied.

25 Claims, 3 Drawing Sheets

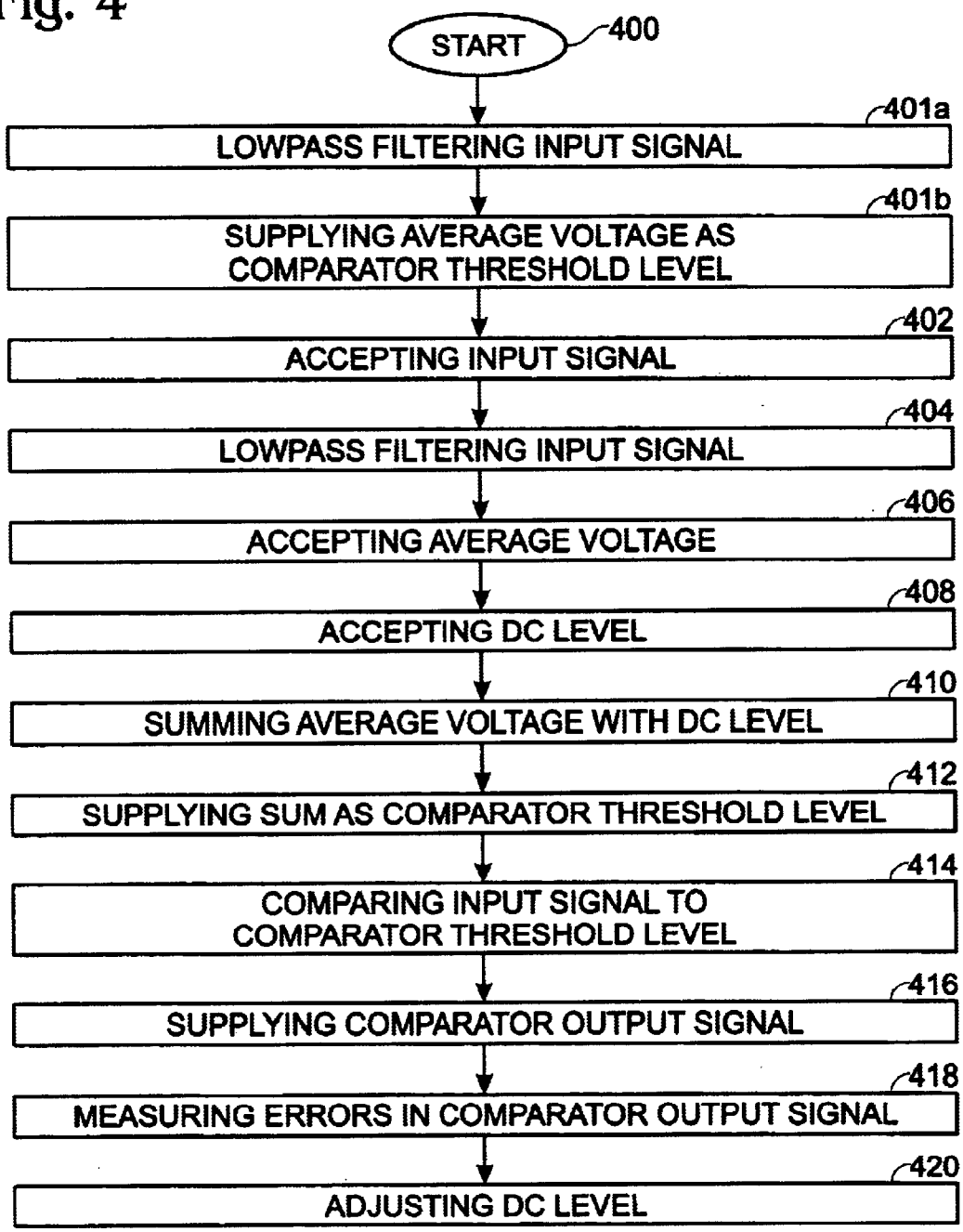

SYSTEM AND METHOD FOR COMPARATOR THRESHOLD ADJUSTMENT

BACKGROUND OF THE INVENTION

1. Field of the Invention

This invention generally relates to electronic circuits implemented with transistors and, more particularly, to a system and method for adjusting the threshold voltage of a comparator circuit in response to changes in the dc level of an input signal that is being compared to the threshold.

2. Description of the Related Art

FIG. 1 is a schematic diagram of a conventional comparator circuit (prior art). The circuit compares an ac signal to a threshold voltage and generates an output signal when the ac signal exceeds the threshold voltage. This particular circuit uses a lowpass filter to integrate the ac signal, so that the threshold voltage is the same as the input signal average voltage. If the dc level of the input signal changes, or if the ac signal becomes saturated or distorted, in response to a change in temperature or a variation in the supply voltage for example, the circuit will track the changes in the input signal average voltage. If the dc level of the input signal decreases, the threshold voltage decreases.

However, the above circuit is only of value if an approximately mid-level threshold voltage is required. That is, the lowpass filter supplies an approximately 2.5 volt threshold in response to a 5 volt (zero to 5 volt swing) input signal. If a 1 volt threshold is desired, it cannot be generated by the lowpass filter. Even if a resistive voltage divider is added between the lowpass filter and the comparator threshold input, to divide the voltage from 2.5 volts to 1 volt (in ideal conditions), the divider will also act to divide any compensation to the 1 volt threshold as the input signal varies from the ideal condition. Thus, the corrections are non-linear.

It would be advantageous if a comparator threshold voltage could be compensated for changes in the input signal dc level or average voltage.

It would be advantageous if the above-mentioned compensation could be performed at any threshold level.

SUMMARY OF THE INVENTION

The present invention compensation circuit tracks changes in the average voltage of a signal being input to a comparator for comparison to a threshold voltage. The comparator can be calibrated to operate at a predetermined threshold level and the tracked changes are used to modify the comparator threshold level, after calibration. The present invention compensation circuit linearly performs the modifications to any level of threshold voltage. That is, the threshold level is not restricted to the approximately mid-voltage level described in the explanation of FIG. 1.

Accordingly, a method is provided for compensating a comparator threshold level. The method comprises: accepting an input signal with an ac component; lowpass filtering the input signal to generate the input signal average voltage; accepting the input signal average voltage; accepting a first dc level (Vopt); summing the average voltage with the first dc level; supplying a first sum (Vr1) as a first comparator threshold level; comparing the input signal to the first comparator threshold level; and, supplying a first comparator output signal with an ac component.

In some aspects of the method, accepting a first dc level includes accepting a plurality of dc levels. Then, summing the average voltage with the first dc level includes summing the average voltage with each of the plurality of dc levels. Supplying a first sum as a comparator threshold voltage includes supplying a plurality of sums as a corresponding plurality of comparator threshold levels. Comparing the input signal to the first comparator threshold level includes comparing the input signal to each of the comparator threshold levels. Finally, supplying a first comparator output signal includes supplying a plurality of comparator output signals.

Additional details of the above-described method, and a comparator compensation system are described below.

BRIEF DESCRIPTION OF THE DRAWINGS

FIG. 4 is a flowchart illustrating the present invention method for compensating a comparator threshold level.

DETAILED DESCRIPTION OF THE PREFERRED EMBODIMENTS

Figure 1:
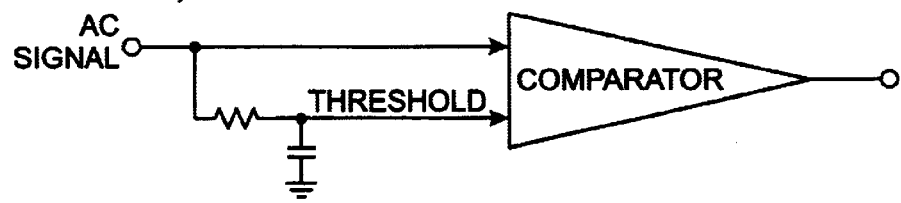
FIG. 1 is a schematic diagram of a conventional comparator circuit (prior art).
Figure 2:
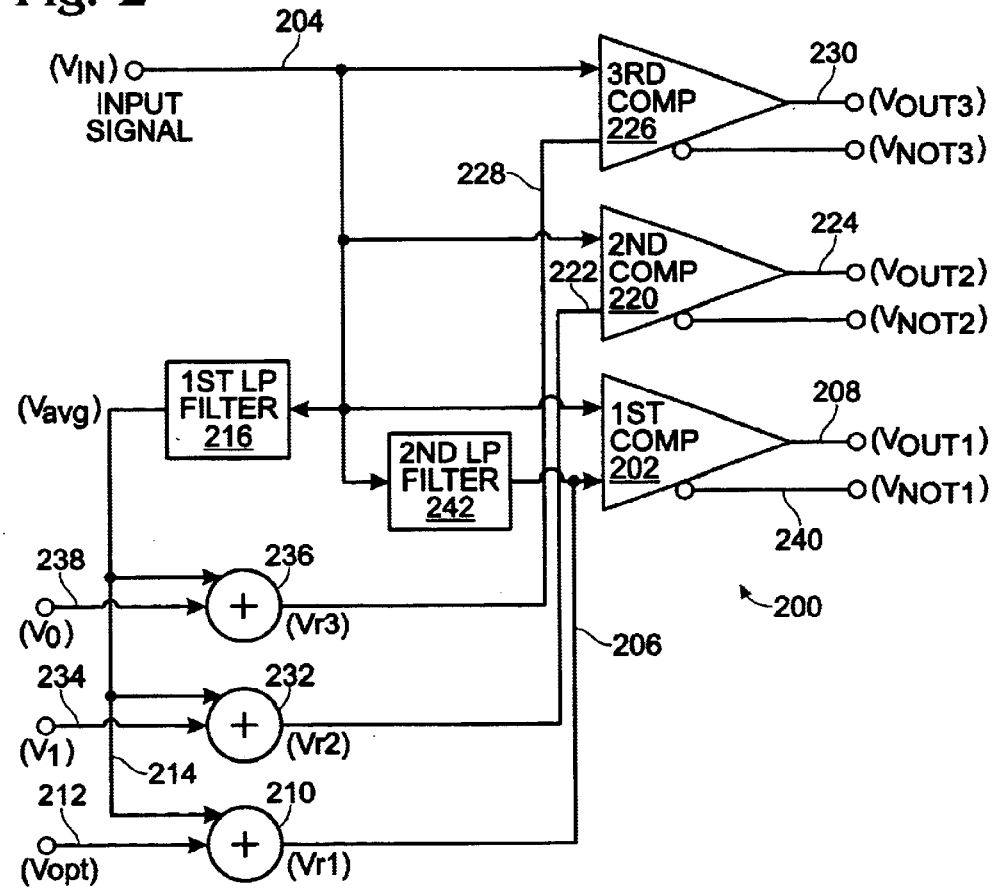
FIG. 2 is a schematic block diagram of the present invention comparator compensation system.

FIG. 2 is a schematic block diagram of the present invention comparator compensation system. The system 200 comprises a first comparator 202 having an input on line 204 to accept an input signal (Vin), an input on line 206 t6 accept a first comparator threshold signal, and an output on line 208 to supply a first comparator output signal (Vout1). A first summing operational amplifier 210 has an input on line 212 to accept a first dc level (Vopt), an input on line 214 to accept an average input voltage (Vavg), and an output connected to the first comparator on line 206, to supply a first sum (Vr1) as the first comparator threshold voltage.

Generally, the input signal is described below as an ac signal. However, the compensation circuit is equally applicable to the compensation of dc input signals. That is because the present invention responds to both changes in dc level as well changes to the ac characteristics of the input signal. However, an ac input signal will be used as an example. The first comparator 202 accepts an input signal on line 204 with an ac component and supplies an output signal on line 208 with an ac component.

A first lowpass filter 216 has an input to accept the input signal on line 204 and an output connected to the first summing operational amplifier 210 on line 214 to supply the average voltage.

Figure 3:
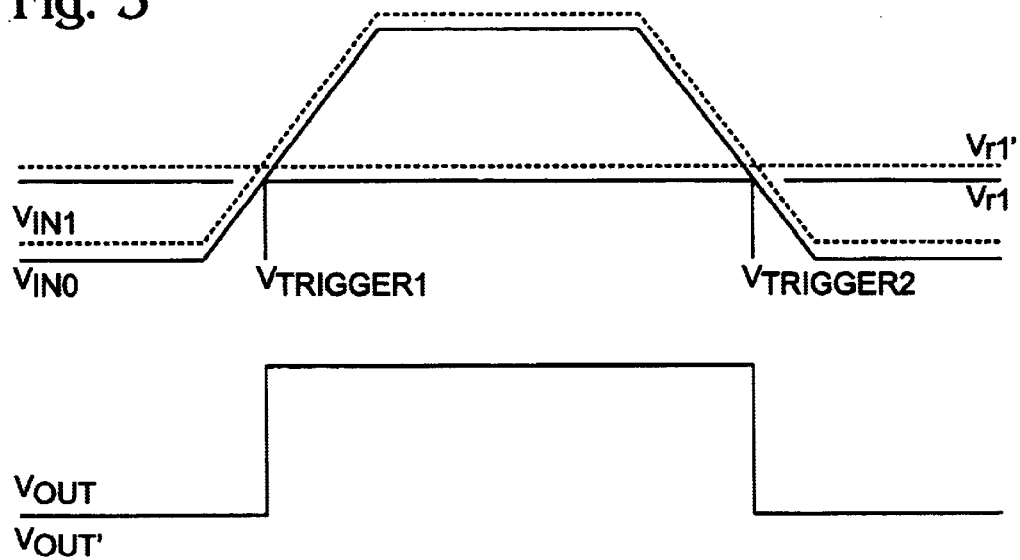
FIG. 3 is a signal diagram illustrating the operation of the present invention compensation system.

FIG. 3 is a signal diagram illustrating the operation of the present invention compensation system. Vin0 is the input signal in an initial condition. In response to the average voltage and the dc level (Vopt), the threshold voltage Vr1 is developed, and Vout1 is created. Vin1 represents a second condition where the dc level of the input signal has shifted higher. The change in the input signal is tracked with the average voltage. The changed average voltage is summed with Vopt, which remains the same, to generate a higher voltage threshold level Vr1'. As a result of the higher threshold, the output (Vout') remains the same as Vout in the initial condition.

Returning to FIG. 2, the present invention system 200 as shown, further comprises a second comparator 220 having an input on line 204 to accept the input signal, an input on line 222 to accept a second comparator threshold signal, and an output on line 224 to supply a second comparator output signal (Vout2). Likewise, a third comparator 226 has an input to accept the input signal on line 204, an input to accept a third comparator threshold signal on line 228, and an output on line 230 to supply a third comparator output signal (Vout3).

A second summing operational amplifier 232 has an input on line 234 to accept a second dc level (V1), an input on line 214 to accept the average input voltage, and an output connected to the second comparator on line 222, to supply a second sum (Vr2) as the second comparator threshold voltage. A third summing operational amplifier 236 has an input on line 238 to accept a third dc level (V0), an input on line 214 to accept the average input voltage, and an output connected to the third comparator on line 228, to supply a third sum (Vr3) as the third comparator threshold voltage.

The output of the first lowpass filter 216 is connected to the inputs of the second and third summing operational amplimiers on lines 214. In some aspects of the system the lowpass filter includes a series resistor (not shown) to accept the input signal on line 204, followed by a capacitor (not shown) to a reference voltage such as ground. However, the system is not limited to merely this type of lowpass filter design.

Generally, from the explanation of FIG. 2 it can be extrapolated that the present invention system 200 may comprise a plurality of comparators each having an input to accept the input signal, an input to accept a comparator threshold signal, and an output to supply an output signal. Then, the system 200 would include a plurality of summing operational amplifiers each having an input to accept a dc level, an input to accept the average input voltage, and an output connected to a corresponding comparator, to supply a sum as a comparator threshold voltage. The first lowpass filter output would be connected to the input of each of the summing operational amplifiers.

In some aspects of the system 200, the first comparator 202 accepts a single-ended input signal on line 204 and supplies a first comparator differential output signal on lines 208 (Vout1) and lines 240 (Vnot1). Likewise, any other comparator in the system may supply a differential signal in response to accepting a single-ended signal. In other aspects, the first comparator 202, or any other comparator in the system, accepts an input signal on line 204 having an ac component data rate of greater than 10 gigabits per second (Gbs).

Some aspects of the system further comprise a second lowpass filter 242 having an input on line 204 to accept the input voltage and an output connected to the first comparator on line 206 to supply the average input voltage as the first comparator threshold signal. The second lowpass filter 242 can be used in circumstances when the compensation circuit is not engaged. Alternately, the second lowpass filter 242 can be used in calibration, to establish the level of the Vopt signal on line 212. Other dc levels, such as V0 and V1, can be derived from Vopt if additional comparators are being used.

FIG. 4 is a flowchart illustrating the present invention method for compensating a comparator threshold level. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 400.

Step 402 accepts an input signal with an ac component. Step 404 lowpass filters the input signal to generate the input signal average voltage. Step 406 accepts the input signal average voltage. Step 408 accepts a first dc level (Vopt). Step 410 sums the average voltage with the first dc level. Step 412 supplies a first sum (Vr1) as a first comparator threshold level. Step 414 compares the input signal to the first comparator threshold level. Step 416 supplies a first comparator output signal with an ac component.

In some aspects of the method, comparing the input signal to the first comparator threshold level in Step 414 includes comparing the input signal ac component to the first comparator threshold level. As noted above, the present invention method is equally applicable to compensating input signal dc levels. That is, a dc input signal could be compared to the first comparator threshold level.

In some aspects, accepting a first dc level in Step 408 includes accepting a plurality of dc levels. Summing the average voltage with the first dc level in Step 410 includes summing the average voltage with each of the plurality of dc levels. Supplying a first sum as a comparator threshold voltage in Step 412 includes supplying a plurality of sums as a corresponding plurality of comparator threshold levels. Comparing the input signal to the first comparator threshold level in Step 414 includes comparing the input signal to each of the comparator threshold levels. Then, supplying a first comparator output signal in Step 416 includes supplying a plurality of comparator output signals.

More specifically, in other aspects, accepting a plurality of dc levels in Step 408 includes accepting the first dc level (Vopt), a second dc level (V1), higher in voltage than the first dc level, and a third dc level (V0), lower in voltage than the first dc level. Summing the average voltage with each of the plurality of dc levels in Step 410 includes summing the average voltage with the first, second, and third dc levels. Supplying a plurality of sums as a corresponding plurality of comparator threshold levels in Step 412 includes supplying a first sum, a second sum (Vr2), and a third sum (Vr3). Comparing the input signal to each of the comparator threshold levels in Step 414 includes comparing the input signal to a first comparator level, a second comparator level, and a third comparator level. Then, supplying a plurality of comparator output signals in Step 416 includes supplying a first comparator output signal, a second comparator output signal, and a third comparator output signal.

In some aspects of the method, accepting an input signal with an ac component in Step 402 includes accepting a single-ended input signal, and supplying a first comparator output signal in Step 416 includes supplying a first comparator differential output signal.

Other aspects of the method include further steps. Step 418 measures errors in the first comparator output signal. Step 420 adjusts the first dc level in response to the measured errors. Likewise, in yet other aspects, Step 418 measuring errors in the first, second, and third comparator output signals. Then, Step 420 adjusts the first, second, and third dc levels in response to the measured errors.

In some aspects, accepting an input signal with an ac component in Step 402 includes accepting an input signal having an ac component data rate of greater than 10 gigabits per second (Gbs).

Some aspects of the method include further steps, such as might be performed during initial calibration. Step 401a lowpass filters the input signal to generate the input signal average voltage. Step 401b supplies the input signal average voltage as the first comparator threshold level.

A comparator compensation system and method have been described above. A specific example has been given to illustrate the present invention features. However, the invention is not limited to merely this example. Other variations and embodiments of the invention will occur to those skilled in the art.

We claim:

1. A method for compensating a comparator threshold level, the method comprising:
   accepting a single-ended input signal with an ac component;
   accepting an input signal average voltage;
   accepting a first dc level (Vopt);
   summing the input signal average voltage with the first dc level;
   supplying a first sum (Vr1) as a first comparator threshold level;
   comparing the input signal to the first comparator threshold level; and,
   supplying a first comparator differential output signal with the ac component.

2. The method of claim 1 wherein comparing the input signal to the first comparator threshold level includes comparing the input signal ac component to the first comparator threshold level.

3. The method of claim 2 further comprising:
   lowpass filtering the input signal to generate the input signal average voltage.

4. The method of claim 3 further comprising:
   accepting a plurality of dc levels;
   summing the input signal average voltage with each of the plurality of dc levels;
   supplying a plurality of sums as a corresponding plurality of comparator threshold levels;
   comparing the input signal to each of the comparator threshold levels; and,
   supplying a plurality of comparator output signals.

5. The method of claim 4 wherein accepting a plurality of dc levels includes accepting the first dc level Vopt), a second dc level (V1), higher in voltage than the first dc level, and a third dc level (V0), lower in voltage than the first dc level;
   wherein summing the input signal average voltage with each of the plurality of dc levels includes summing the average voltage with the first, second, and third dc levels;
   wherein supplying a plurality of sums as a corresponding plurality of comparator threshold levels includes supplying a first sum, a second sum (Vr2), and a third sum (Vr3);
   wherein comparing the input signal to each of the comparator threshold levels includes comparing the input signal to a first comparator level, a second comparator level, and a third comparator level; and,
   supplying a plurality of comparator output signals includes supplying a first comparator output signal, a second comparator output signal, and a third comparator output signal.

6. The method of claim 1 further comprising:
   measuring errors in the first comparator output signal, and,
   adjusting the first dc level in response to the measured errors.

7. The method of claim 5 further comprising:
   measuring errors in the first, second, and third comparator output signals; and,
   adjusting the first, second, and third dc levels in response to the measured errors.

8. The method of claim 1 wherein accepting an input signal with an ac component includes accepting an input signal having an a component data rate of greater than 10 gigabits per second (Gbs).

9. A comparator compensation system comprising:
   a first comparator having an input to accept a single-ended input signal, an input to accept a first comparator threshold signal, and an output to supply a first comparator differential output signal; and,
   a first summing operational amplifier having an input to accept a first dc level (Vopt), an input to accept an average input voltage, and an output connected to the first comparator to supply a first sum (Vr1) as the first comparator threshold signal.

10. The system of claim 9 wherein the first comparator accepts an input signal with an ac component and supplies output signals with an ac component.

11. The system of claim 9 further comprising:
    a first lowpass filter having an input to accept the input signal and an output connected to the first summing operational amplifier to supply the average voltage.

12. The system of claim 11 further comprising:
    a plurality of comparators each having an input to accept the input signal, an input to accept a comparator threshold signal, and an output to supply an output signal; and,
    a plurality of summing operational amplifiers each having an input to accept a dc level, an input to accept the average input voltage, and an output connected to a corresponding comparator to supply a sum as a comparator threshold voltage.

13. The system of claim 12 wherein the first lowpass filter output is connected to the input of each of the summing operational amplifiers.

14. The system of claim 11 further comprising:
    a second comparator having an input to accept the input signal, an input to accept a second comparator threshold signal, and an output to supply a second comparator output signal;
    a third comparator having an input to accept the input signal, an input to accept a third comparator threshold signal, and an output to supply a third comparator output signal;
    a second summing operational amplifier having an input to accept a second dc level (V1), an input to accept the average input voltage, and an output connected to the second comparator to supply a second sum (Vr2) as the second comparator threshold voltage; and,
    a third summing operational amplifier having an input to accept a third dc level (V0), an input to accept the average input voltage, and an output connected to the third comparator to supply a third sum Vr3) as the third comparator threshold voltage.

15. The system of claim 14, wherein the first lowpass filter output is connected to the inputs of the second and third summing operational amplifiers.

16. The system of claim 9 wherein the first comparator accepts an input signal having an ac component data rate of greater than 10 gigabits per second (Gbs).

17. The system of claim 9 further comprising:
    a first lowpass filter having an input to accept the input signal and an output connected to the first comparator to supply the average input voltage as the first comparator threshold signal.

18. A method for compensating a comparator threshold level, the method comprising:

accepting an input signal with an ac component;

accepting an input signal average voltage;

accepting a first dc level (Vopt);

summing the input signal average voltage with the first dc level;

supplying a first sum (Vr1) as a first comparator threshold level;

comparing the input signal to the first comparator threshold level;

supplying a first comparator output signal with the ac component measuring errors in the first comparator output signal; and, adjusting the first dc level in response to the measured errors.

19. The method of claim 18 wherein comparing the input signal to the first comparator threshold level includes comparing the input signal ac component to the first comparator threshold level.

20. The method of claim 19 further comprising:

lowpass filtering the input signal to generate the input signal average voltage.

21. The method of claim 20 further comprising:

accepting a plurality of dc levels;

summing the input signal average voltage with each of the plurality of dc levels;

supplying a plurality of sums as a corresponding plurality of comparator threshold levels;

comparing the input signal to each of the comparator threshold levels; and, supplying a plurality of comparator output signals.

22. The method of claim 21 wherein accepting a plurality of dc levels includes accepting the first dc level (Vopt), a second dc level (V1), higher in voltage than the first dc level, and a third dc level (V0), lower in voltage than the first dc level;

wherein summing the input signal average voltage with each of the plurality of dc levels includes summing the average voltage with the first, second, and third dc levels;

wherein supplying a plurality of sums as a corresponding plurality of comparator threshold levels includes supplying a first sum, a second sum (Vr2), and a third sum (Vr3);

wherein comparing the input signal to each of the comparator threshold levels includes comparing the input signal to a first comparator level, a second comparator level, and a third comparator level; and, supplying a plurality of comparator output signals includes supplying a first comparator output signal, a second comparator output signal, and a third comparator output signal.

23. The method of claim 18 wherein accepting an input signal with an ac component includes accepting a single-ended input signal; and, wherein supplying a first comparator output signal includes supplying a first comparator differential output signal.

24. The method of claim 22 further comprising:

measuring errors in the first, second, and third comparator output signals; and, adjusting the first, second, and third dc levels in response to the measured errors.

25. A method for compensating a comparator threshold level, the method comprising:

accepting an input signal with an ac component;

lowpass filtering the input signal to generate an input signal average voltage;

accepting a first dc level (Vopt), a second dc level (V1), higher in voltage than the first dc level, and a third dc level V0), lower in voltage than the first dc level;

summing the input signal average voltage with each of the first, second, and third dc levels;

supplying a first sum (Vr1), a second sum (Vr2), and a third sum (Vr3) as corresponding first, second, and third comparator threshold levels;

comparing the input signal ac component to the first, second, and third comparator levels;

supplying a first comparator output signal, a second comparator output signal, and a third comparator output signal;

measuring errors in the first, second, and third comparator output signals; and, adjusting the first, second, and third dc levels in response to the measured errors.

* * * * *